US012512802B2

(12) United States Patent
Lee et al.

(10) Patent No.: US 12,512,802 B2
(45) Date of Patent: Dec. 30, 2025

(54) RENDERING METHOD OF PREVENTING OBJECT-BASED AUDIO FROM CLIPPING AND APPARATUS FOR PERFORMING THE SAME

(71) Applicant: Electronics and Telecommunications Research Institute, Daejeon (KR)

(72) Inventors: Yong Ju Lee, Daejeon (KR); Jae-hyoun Yoo, Daejeon (KR); Dae Young Jang, Daejeon (KR); Soo Young Park, Daejeon (KR); Young Ho Jeong, Daejeon (KR); Kyeongok Kang, Daejeon (KR); Tae Jin Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 183 days.

(21) Appl. No.: 18/480,259

(22) Filed: Oct. 3, 2023

(65) Prior Publication Data

US 2024/0136993 A1 Apr. 25, 2024
US 2024/0235511 A9 Jul. 11, 2024

(30) Foreign Application Priority Data

Oct. 21, 2022 (KR) ........................ 10-2022-0136113
Apr. 5, 2023 (KR) ........................ 10-2023-0044489

(51) Int. Cl.
*H03G 7/00* (2006.01)

(52) U.S. Cl.
CPC .................................. *H03G 7/007* (2013.01)

(58) Field of Classification Search
CPC ..... H03G 7/007; G10L 21/038; G10L 19/008; G10L 21/0276; G10L 19/0081; G10L 21/0338; H04S 7/00
See application file for complete search history.

(56) References Cited

U.S. PATENT DOCUMENTS 10,405,122 B1 9/2019 Jang et al.
10,950,248 B2 3/2021 Lee et al.
11,622,193 B2 * 4/2023 Huang ..................... H04R 3/02
381/99

FOREIGN PATENT DOCUMENTS

KR 10-1882898 7/2018
KR 10-2021-0067871 6/2021

OTHER PUBLICATIONS

ISO/IEC JTC1/SC29/WG6/N147, "Second version of Text of MPEG-I Immersive Audio Working Draft of RM0", ISO 23090-4:202#(X), 2022, pp. 1-287.

* cited by examiner

*Primary Examiner* — Rasha S Al Aubaidi
(74) *Attorney, Agent, or Firm* — KILE PARK REED & HOUTTEMAN PLLC

(57) ABSTRACT

A rendering method of an object-based audio signal and an apparatus for performing the same are provided. The rendering method of an object-based audio signal includes obtaining a rendered audio signal, performing clipping prevention on the rendered audio signal using a first limiter, mixing a signal output by the first limiter using a mixer, and performing clipping prevention on the mixed signal using a second limiter.

9 Claims, 12 Drawing Sheets

RENDERING METHOD OF PREVENTING OBJECT-BASED AUDIO FROM CLIPPING AND APPARATUS FOR PERFORMING THE SAME

CROSS-REFERENCE TO RELATED APPLICATION

This application claims the benefit of Korean Patent Application No. 10-2022-0136113 filed on Oct. 21, 2022 and Korean Patent Application No. 10-2023-0044489 filed on Apr. 5, 2023, in the Korean Intellectual Property Office, the entire disclosures of which are incorporated herein by reference for all purposes.

BACKGROUND

1. Field of the Invention

The following disclosure relates to a rendering method of preventing object-based audio from clipping and apparatus for performing the same.

2. Description of the Related Art

An audio service has been developed from mono and stereo services to a multichannel service, such as 9.1, 11.1, 10.2, 13.1, 15.1, and 22.2 channels, passing through 5.1 and 7.1 channels. Unlike a conventional channel-based audio service, an object-based audio service technique that regards a single sound source as an object has been developed. The object-based audio service may store, transmit, and play an object audio signal and object audio-related information (e.g., a position and the size of object audio).

When rendering an object-based audio signal, the required information thereof may be a relative angle and a distance between an audio object and a listener. An object-based audio signal may be rendered by additionally using acoustic spatial information. The acoustic spatial information may be information for better realizing acoustic transmission characteristics according to a space. A significantly complex computation may be required to implement acoustic transmission characteristics using acoustic spatial information and render an object-based audio signal. To simply implement acoustic transmission characteristics according to a space, a rendering method of an object-based audio signal by dividing the object-based audio signal into direct sound, early reflection, and late reverberation, is proposed.

The above description is information the inventor(s) acquired during the course of conceiving the present disclosure, or already possessed at the time, and is not necessarily art publicly known before the present application was filed.

SUMMARY

An embodiment may provide a rendering method of an object-based audio signal to prevent clipping while preventing the sound volume of an audio object from being affected by the sound volume of another audio object based on a distance between a listener and the audio object.

However, the technical aspects are not limited to the aforementioned aspects, and other technical aspects may be present.

According to an aspect, there is provided a rendering method of an object-based audio signal, the method including obtaining a rendered audio signal, performing clipping prevention on the rendered audio signal using a first limiter, mixing a signal output by the first limiter using a mixer, and performing clipping prevention on the mixed signal using a second limiter.

The rendered audio signal is obtained by rendering a plurality of render items generated by an audio object and mixing the render items for each object.

The rendered audio signal is obtained by rendering a single render item generated by an audio object.

The first limiter includes a plurality of limiters.

Each of the plurality of limiters is allocated to each audio object.

Each of the plurality of limiters is allocated to each render item generated by an audio object.

According to an aspect, there is provided an apparatus for rendering an object-based audio signal, the apparatus including a memory including instructions, and a processor electrically connected to the memory and configured to execute the instructions, wherein the processor performs a plurality of operations when the instructions are executed by the processor, and wherein the plurality of operations further includes obtaining a rendered audio signal, performing clipping prevention on the rendered audio signal using a first limiter, mixing a signal output by the first limiter using a mixer, and performing clipping prevention on the mixed signal using a second limiter.

The rendered audio signal is obtained by rendering a plurality of render items generated by an audio object and mixing the render items for each object.

The rendered audio signal is obtained by rendering a single render item generated by an audio object.

The first limiter includes a plurality of limiters.

Each of the plurality of limiters is allocated to each audio object.

Each of the plurality of limiters is allocated to each render item generated by an audio object.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
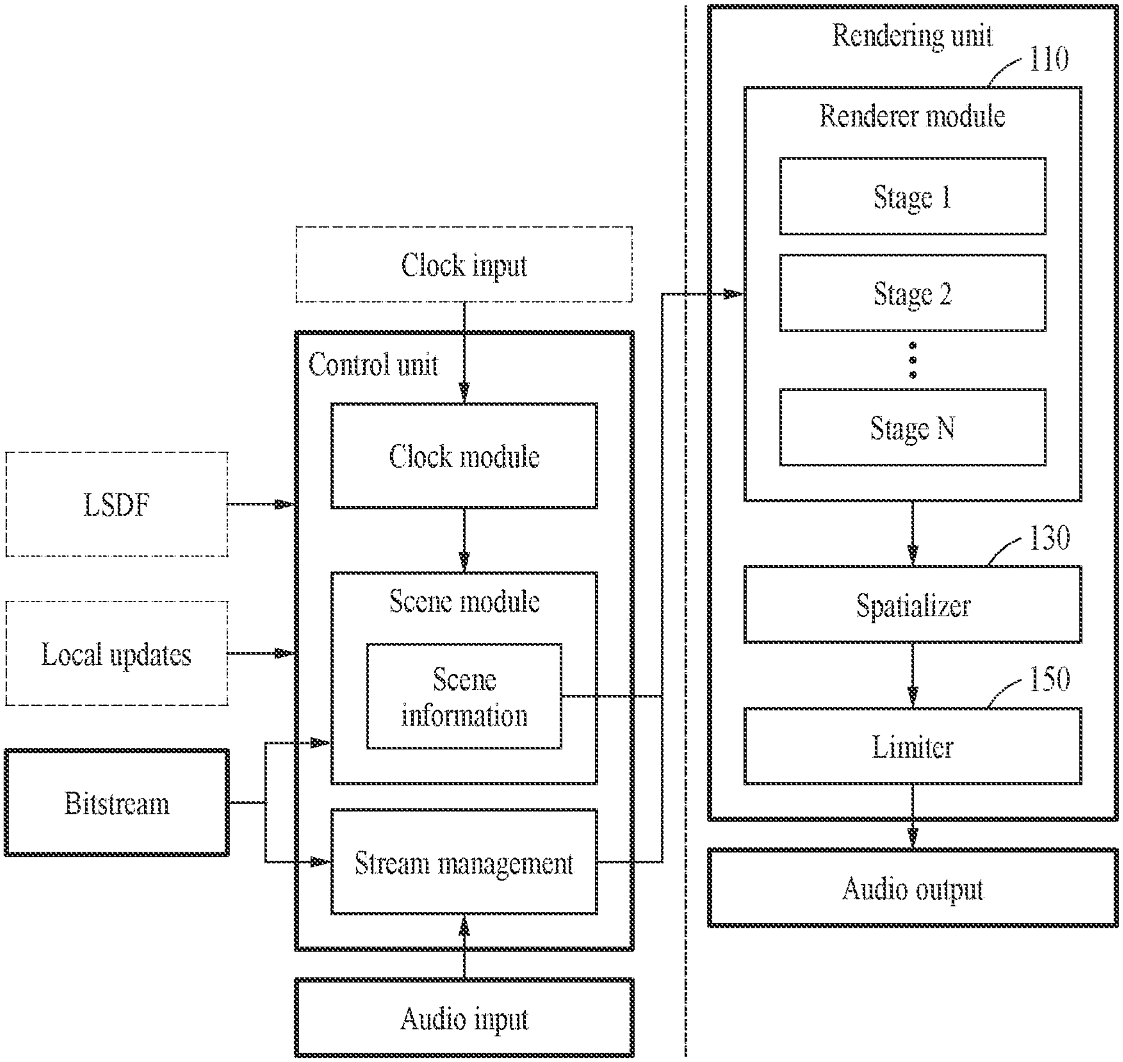
FIG. 1 is a block diagram illustrating an overview of a moving picture experts group (MPEG)-I immersive audio standard renderer component.

The following detailed structural or functional description is provided as an example only and various alterations and modifications may be made to the examples. Here, the examples are not construed as limited to the disclosure and should be understood to include all changes, equivalents, and replacements within the idea and the technical scope of the disclosure.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

It should be noted that if one component is described as being "connected", "coupled", or "joined" to another component, a third component may be "connected", "coupled", and "joined" between the first and second components, although the first component may be directly connected, coupled, or joined to the second component.

The singular forms "a," "an," and "the" are intended to include the plural forms as well, unless the context clearly indicates otherwise. As used herein, "A or B", "at least one of A and B", "at least one of A or B", "A, B or C", "at least one of A, B and C", and "at least one of A, B, or C," each of which may include any one of the items listed together in the corresponding one of the phrases, or all possible combinations thereof. It will be further understood that the terms "comprises/including" and/or "includes/including" when used herein, specify the presence of stated features, integers, operations, operations, elements, and/or components, but do not preclude the presence or addition of one or more other features, integers, operations, operations, elements, components and/or groups thereof.

Unless otherwise defined, all terms, including technical and scientific terms, used herein have the same meaning as commonly understood by one of ordinary skill in the art to which this disclosure pertains. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used in connection with the present disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented in a form of an application-specific integrated circuit (ASIC).

The term "unit" or the like used herein may refer to a software or hardware component, such as a field-programmable gate array (FPGA) or an application-specific integrated circuit (ASIC), and the "unit" performs predefined functions. However, "unit" is not limited to software or hardware. The "unit" may be configured to reside on an addressable storage medium or configured to operate one or more processors. Accordingly, the "unit" may include, for example, components, such as software components, object-oriented software components, class components, and task components, processes, functions, attributes, procedures, sub-routines, segments of program code, drivers, firmware, microcode, circuitry, data, databases, data structures, tables, arrays, and variables. The functionalities provided in the components and "units" may be combined into fewer components and "units" or may be further separated into additional components and "units." Furthermore, the components and "units" may be implemented to operate on one or more central processing units (CPUs) within a device or a security multimedia card. In addition, "unit" may include one or more processors.

Hereinafter, the embodiments will be described in detail with reference to the accompanying drawings. When describing the embodiments with reference to the accompanying drawings, like reference numerals refer to like elements and a repeated description related thereto will be omitted.

FIG. 1 is a block diagram illustrating an overview of a moving picture experts group (MPEG)-I immersive audio standard renderer component.

Referring to FIG. 1, in MPEG, the standardization of an MPEG-I immersive audio has been conducted for a standard of rendering an audio signal in a 6 degree of freedom (DoF) virtual reality (VR) environment. In the standard, a metadata bitstream and real-time rendering technology may be included in a scope of standardization for effectively rendering an audio signal in the 6DoF VR environment.

Channel-based audio, object-based, audio, and scene-based audio may be used as audio in the 6DoF VR environment. Contributions have been made for metadata and real-time rendering technology for rendering audio signals of the above-described audio, an initial version of an MPEG-I immersive audio standard renderer (e.g., a reference model 0 (RM 0)) is selected to be the standard, and core experiments are conducted.

The MPEG-I immersive audio standard renderer may include a control unit and a rendering unit. The control unit may include a clock module, a scene module, and a stream management module. The rendering unit may include a renderer module 110, a spatializer 130, and a limiter 150. The MPEG-I immersive audio standard renderer may render an object-based audio signal (hereinafter, also referred to as an "object audio signal").

The MPEG-I immersive audio standard renderer may prevent clipping by using a limiter (e.g., the limiter 150). Clipping may be an event in which sound is distorted when an audio signal is input and a peak value of the audio signal escapes an input limit of a system. When processing an audio signal, it may be necessary to prevent distortion of the sound due to clipping. The limiter 150 in the MPEG-I immersive audio standard renderer may be disposed between the spatializer 130 and an audio output and may perform clipping prevention.

Figure 2:
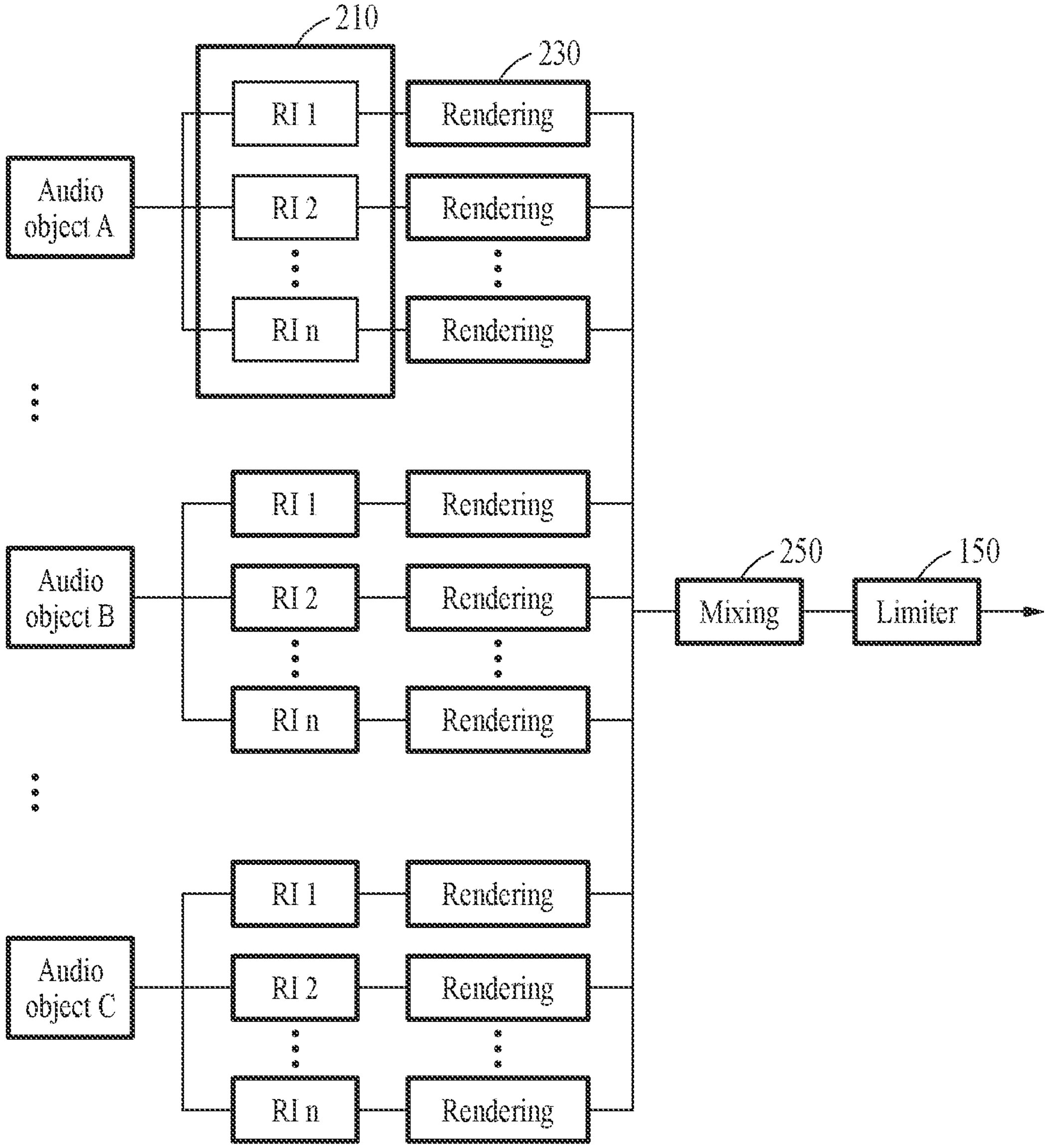
FIG. 2 illustrates a position of a limiter in an MPEG-I immersive audio standard renderer.

FIG. 2 illustrates a position of a limiter in an MPEG-I immersive audio standard renderer.

Referring to FIG. 2, according to one embodiment, an MPEG-I immersive audio standard renderer may perform rendering 230 by dividing an object audio signal into N (e.g., N is a natural number greater than "1") render items (RI) 210. Each of the RIs (e.g., RI 1 to RI n) on which rendering 230 is performed may be mixed 250 by each output channel (e.g., by object audio signals of a left (L) channel and by object audio signals of a right (R) channel). The mixing 250 may be performed by a spatializer (e.g., the spatializer 130 of FIG. 1). The RIs 210 may be mixed in the form of a single object audio signal and may be output to the limiter 150. The limiter 150 may prevent clipping of the object audio signal.

The limiter 150 may check a value of a sample of the object audio signal by frame and when a value of a sample that has the greatest absolute value is greater than a predetermined threshold, the limiter 150 may calculate a value that obtains the greatest absolute value with respect to the predetermined value and may set the value to be the gain value. The MPEG-I immersive audio standard renderer may use a method of applying a gain value to all samples of each frame. When a gain value of a current frame is different from a gain value of a previous frame (e.g., when a gain value of a previous frame is 0.8 and a gain value of a current frame is 0.7), a rapid change in the gain value in samples of a frame at an initial stage may occur. The MPEG-I immersive audio standard renderer may prevent the rapid change in a gain value in samples of a frame at an initial stage through smoothing that gradually changes the gain value of the frame at the initial stage.

In the rendering method of preventing clipping in the MPEG-I immersive audio standard renderer, an amount of computation may be small. However, a sound volume of an audio object (e.g., a first audio object) may be affected by a sound volume of another audio object (e.g., a second audio object) rather than a relationship (e.g., a distance between a listener and the audio object) between a listener and the audio object (e.g., the first audio object).

Figure 3:
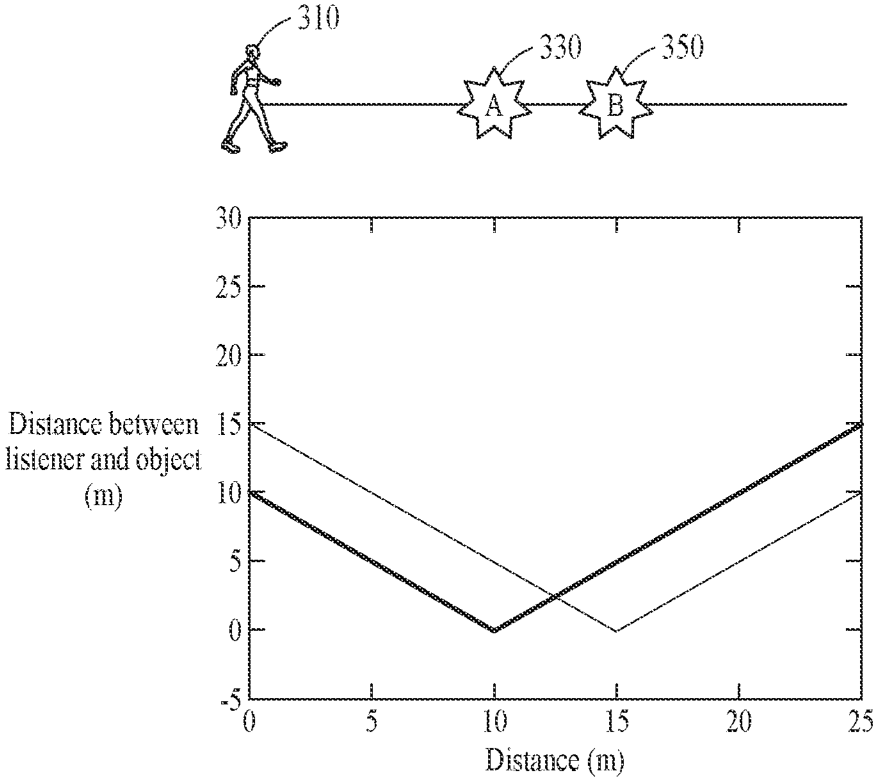
FIG. 3 is a graph illustrating an example of a distance between a listener and an audio object.

FIG. 3 is a graph illustrating an example of a distance between a listener and an audio object.

FIG. 3 may be a graph illustrating a distance between a listener and each audio object when the listener moves from a 0-meter point to a 25-meter point while passing an audio object A and an audio object B. At a 10-meter point, a distance between a listener 310 and an audio object A 330 may be 0 meters and at a 15-meter point, a distance between a listener 330 and an audio object B 350 may be 0 meters.

For ease of description, FIG. 3 assumes that from a starting point of the listener 310, the audio object A 330 may be 10 meters away, the audio object B 350 may be 15 meters away, and a distance between the audio object A 330 and the audio object B 350 may be 5 meters. In addition, a reference distance and a minimum distance (e.g., a threshold of a distance between a listener and an audio object to prevent the sound volume from extremely increasing), which are characteristics of an audio object used by MPEG-I immersive audio, may be set to be 10 meters and 0.2 meters, respectively.

Figure 4:
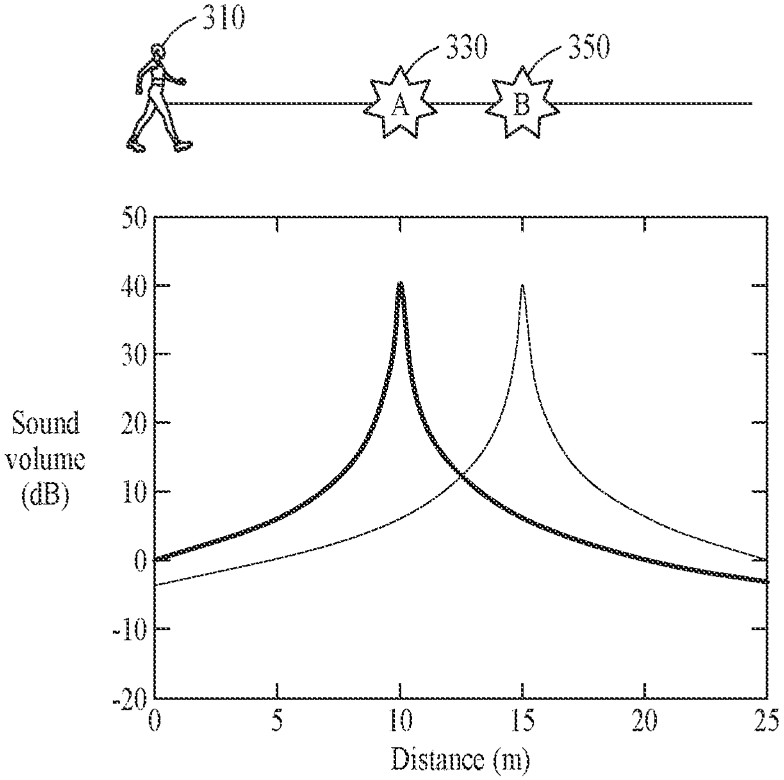
FIG. 4 is an example of a graph illustrating a sound volume based on a distance between a listener and an audio object.

FIG. 4 is an example of a graph illustrating a sound volume based on a distance between a listener and an audio object.

FIG. 4 illustrates a sound volume based on a distance between a listener and an audio object when a limiter does not exist. When the listener 310 moves by passing the audio object A 330 and the audio object B 350, the sound volumes of the audio object A 330 and the audio object B 350 may be inversely proportional to distances between the listener 310 and the audio objects 330 and/or 350, respectively. The sound volume of the audio object 330 and/or 350 may increase when a distance between the listener 310 and the audio object 330 and/or 350 decreases and may decrease when the distance increases.

Figure 5:
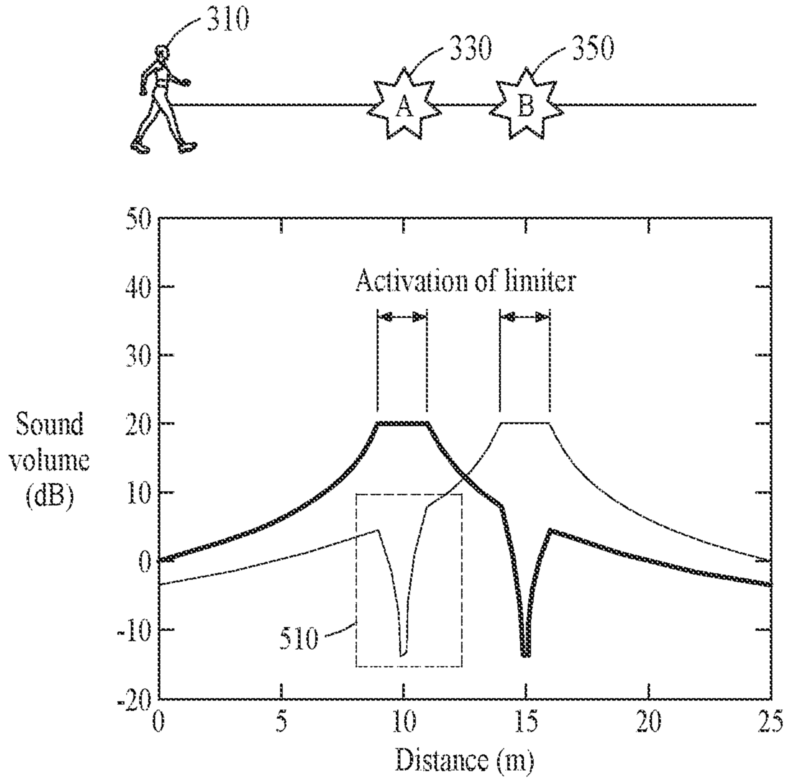
FIG. 5 is an example of a graph illustrating a sound volume based on a distance between a listener and an audio object.

FIG. 5 is an example of a graph illustrating a sound volume based on a distance between a listener and an audio object.

FIG. 5 illustrates a change in a sound volume of an audio object according to the activation of a limiter in an MPEG-I immersive audio standard renderer. A limiter (e.g., the limiter 150 of FIG. 1) may be activated to prevent the occurrence of distortion (e.g., clipping) as a sound volume of an audio object (e.g., the audio object A 330) excessively increases. In a section in which the limiter (e.g., the limiter 150 of FIG. 1) is activated, an event (e.g., 510) in which sound volumes of an audio object (e.g., the audio object A 330), which is a cause of activation of the limiter (e.g., the limiter 150 of FIG. 1), and another audio object (e.g., the audio object B 350) decrease may be observed. For example, when the listener 310 moves to near a 10-meter point, the limiter 150 may be activated to prevent the occurrence of clipping as the sound volume of the audio object A 330 excessively increases. As the sound volume of the audio object A330 increases, a gain value (e.g., a ratio of a threshold of the sound volume to the sound volume of the audio object A 330) of the limiter 150 may decrease. Due to the decrease in the gain value of the limiter 150, an event 510 in which the sound volume of the audio object B 350 decreases may occur. By considering only a distance between the audio object B 350 and the listener 310, as a distance between the listener 310 and the audio object B 350 decreases near the 10-meter point, the sound volume of the audio object B 350 may need to increase. However, due to activation of the limiter 150 in response to a change in the sound volume of the audio object A 330, the event 510 in which the sound volume of the audio object B 350 rather decreases may occur. In the current MPEG-I immersive audio standard renderer, a relative volume level of the sound of the audio object A 330 to the audio object B 350 may be maintained in a section in which the limiter 150 is activated, and thus, it may be difficult to determine that the event 510 in which the sound volume of the audio object B changes is incorrect. Together with the current method of rendering to prevent clipping while maintaining a relative sound volume between audio objects (e.g., the audio object A 330 and the audio object B 350), a mode for preventing a sound volume of an audio object (e.g., the audio object B 350) from being affected by another audio object (e.g., the audio object A 330) may be required.

Figure 6:
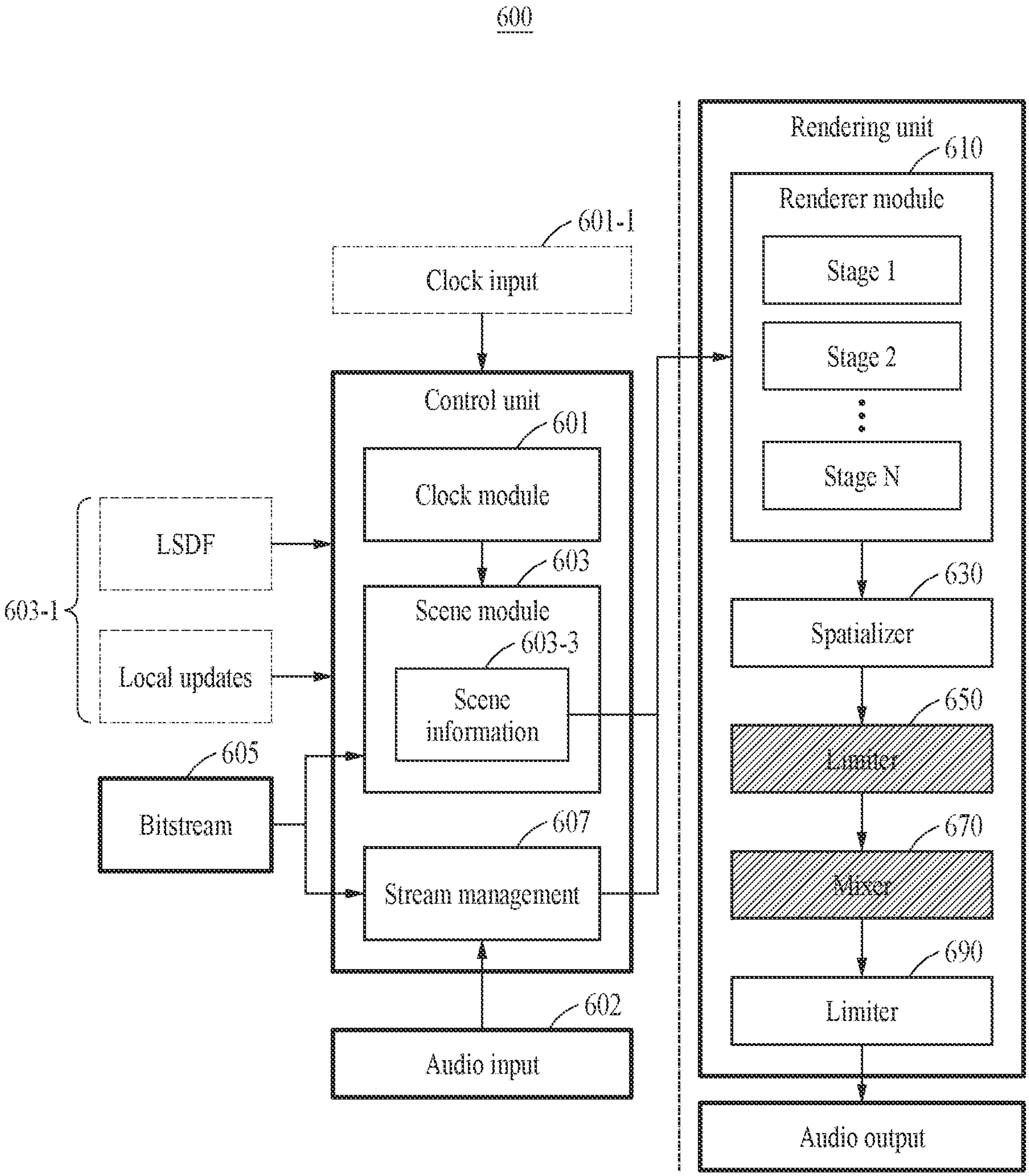
FIG. 6 is a block diagram illustrating an overview of a modified MPEG-I immersive audio renderer component according to one embodiment.

FIG. 6 is a block diagram illustrating an overview of a modified MPEG-I immersive audio renderer component according to one embodiment.

Referring to FIG. 6, according to one embodiment, a modified MPEG-I immersive audio renderer 600 may be a structure in which a limiter and a mixer are added to the MPEG-I immersive audio standard renderer of FIG. 1. Specifically, a limiter 650 and a mixer 670 may be added between a spatializer 630 and a limiter 690.

The modified MPEG-I immersive audio renderer 600 may include a control unit and a rendering unit. The control unit may include a clock module 601, a scene module 603, and a stream management module 605. The rendering unit may include a renderer module 610, the spatializer 630, the limiter 650, the mixer 670, and the limiter 690. The limiter 650 may include a plurality of limiters.

The clock module 601 may receive a clock input 601_1 as an input. The clock input 601_1 may include a synchronization signal with an external module and/or a reference time of the renderer itself. The clock module 601 may output current time information of a scene to the scene module 603.

The scene module 603 may process a change in all internal or external scene information. The scene module 603 may include information (e.g., a listener space description format (LSDF), a listener's location, and local update information 603_1) received from an external interface of a renderer and information (e.g., scene update information) transmitted by the bitstream 605. The scene module 603 may include a scene information module 603_3. The scene information module 603_3 may update a current state of all metadata (e.g., an acoustic element and a physical object) related to 6DoF rendering of a scene. The scene information module 603_3 may output the current scene information to the renderer module 610.

The stream management module 607 may provide an interface for inputting an acoustic signal (e.g., an audio input 602) to an acoustic element of the scene information module 603_3. The audio input 602 may be a pre-encoded or pre-decoded sound source signal, a local sound source, or a remote sound source. The stream management module 607 may output the acoustic signal to the renderer module 610. The renderer module 610 may render the acoustic signal received from the stream management module 607 using the current scene information. The renderer module 610 may include rendering operations for rendering parameter processing and signal processing of an acoustic signal (e.g., a render item), which is a target of rendering.

Figure 7:
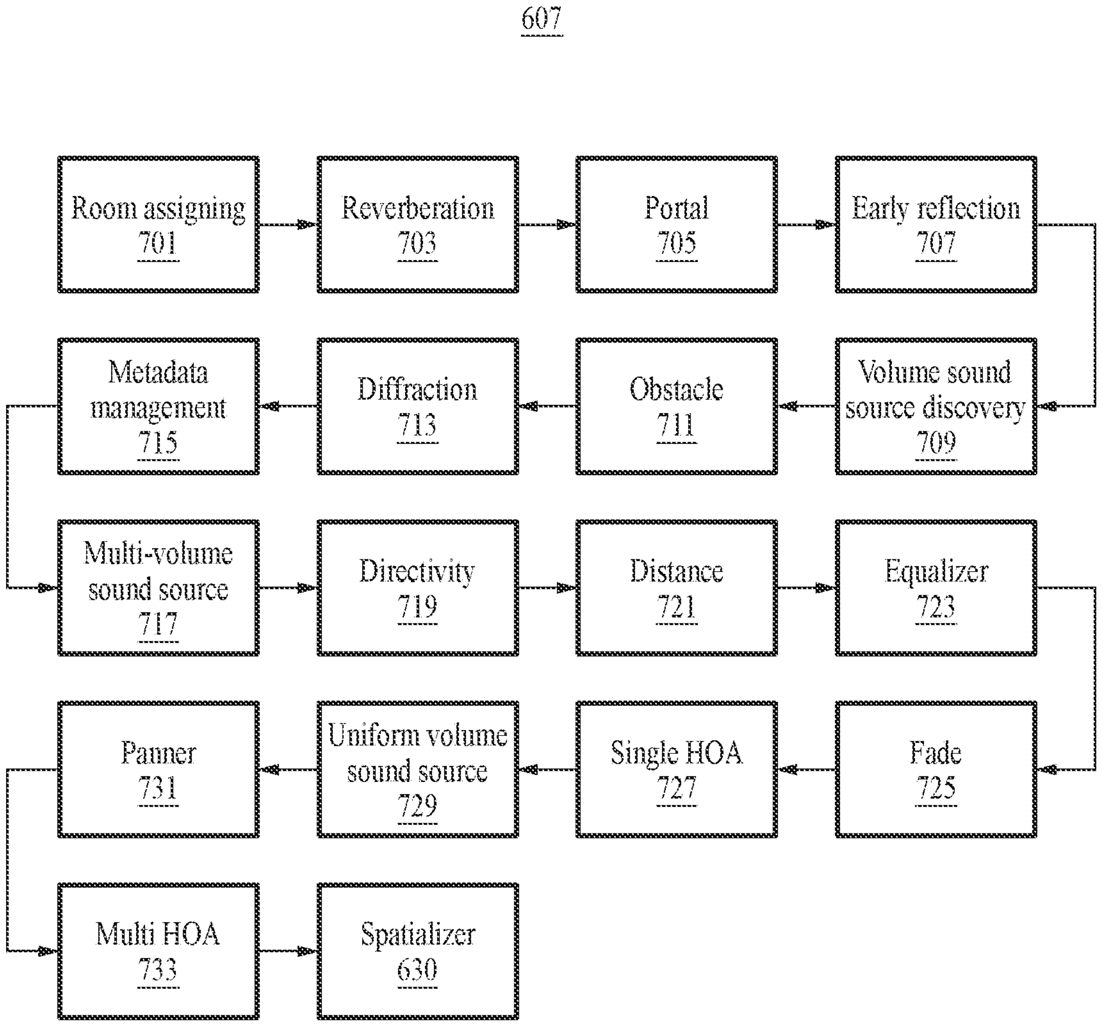
FIG. 7 is a diagram illustrating the rendering operations of a renderer module of the modified MPEG-I immersive audio renderer of FIG. 6, according to one embodiment.

FIG. 7 is a diagram illustrating the rendering operations of a renderer module of the modified MPEG-I immersive audio renderer of FIG. 6, according to one embodiment.

Referring to FIG. 7, according to one embodiment, each rendering operation may be executed in a predetermined order. In each rendering operation, a render item may be selectively deactivated or activated. Each rendering operation may process the rendering of an activated render item. Hereinafter, each rendering operation of the renderer module 607 is described.

A room assigning stage 701 may be an operation of applying metadata of acoustic environment information on a room where a listener enters to each render item when the listener enters the room including the acoustic environment information.

A reverberation stage 703 may be an operation of generating reverberation based on the acoustic environment information of a current space (e.g., a room including acoustic environment information). The reverberation stage 703 may be an operation of attenuating a feedback delay network (FDN) reverberator and initializing a delay parameter by receiving a reverberation parameter from the bitstream 605.

A portal stage 705 may be an operation of modeling a sound transmission path. Specifically, the portal stage 705 may be an operation of modeling a sound transmission path (e.g., a portal) that is partially open at a gap between spaces having different acoustic environment information on late reverberation. In acoustics, the portal may be an abstract concept that models the transmission of sound from one space to another space through a geometrically defined opening. The portal stage 705 may be an operation of modeling the entirety of a space where a sound source is positioned into a sound source in a uniform volume. The portal stage 705 may be an operation of rendering a render item to a uniform volume sound source by regarding a wall as an obstacle based on shape information of the portal included in the bitstream 605.

An early reflection stage 707 may be an operation of selecting a rendering method by considering rendering quality and an amount of computation. The early reflection stage 707 may be omitted. A rendering method that may be selected in the early reflection stage 707 may include a high-quality early reflection rendering method and a low-complexity early reflection rendering method. The high-quality early reflection rendering method may be a method of calculating early reflection by determining the visibility of an image source with respect to an early reflection wall that occurs early reflection included in the bitstream 605. The low-complexity early reflection rendering method may be a method of replacing an early reflection section by using a predefined and simple early reflection pattern.

The volume sound source discovery stage 709 may be an operation of finding an intersection point of a sound line, which is radiated in multiple directions, and each portal or a volume sound source to render a sound source (e.g., the volume sound source) having a spatial size including the portal. Information (e.g., an intersection point of a sound line and a portal) obtained in the volume sound source discovery stage 709 may be output to an obstacle stage 711 and a uniform volume sound source stage 729.

The obstacle stage 711 may provide information on an obstacle on a straight path between a sound source and a listener. The obstacle stage 711 may be an operation of updating a status flag for fade in-out processing at a boundary of the obstacle and an equalizer (EQ) parameter by transmittance of the obstacle.

A diffraction stage 713 may be an operation of generating information required to generate a diffracted sound source by a sound source blocked by an obstacle, wherein the diffracted sound source is transmitted to a listener. For a fixed sound source, a pre-calculated diffraction path may be used for generating the information. For a moving sound source, a diffraction path that is calculated by a latent diffraction edge may be used for generating the information.

The metadata management stage 715 may be an operation of deactivating a render item attenuated to reduce an amount of computation in the following operations when the render item is distance attenuated or is attenuated below an audible range by an obstacle.

A multi-volume sound source stage 717 may be an operation of rendering a sound source having a spatial size including a plurality of sound source channels.

A directivity stage 719 may be an operation of applying a directivity parameter (e.g., a gain for each band) related to the current direction of a sound source for a render item of which directivity information is defined. The directivity stage 719 may be an operation of additionally applying a gain for each band to an existing EQ value.

A distance stage 721 may be an operation of applying an effect based on a delay due to a distance between a sound source and a listener, distance attenuation, and air absorption attenuation.

An equalizer stage 723 may be an operation of applying a finite impulse response (FIR) filter to a gain value for each frequency band accumulated by obstacle transmission, diffraction, early reflection, directivity, distance attenuation, and the like.

A fade stage 725 may be an operation of attenuating discontinuous distortion through fade in-out processing wherein the discontinuous distortion may occur when an activation status of a render item changes or a listener suddenly moves in a space.

A single higher order ambisonics (HOA) stage 727 may be an operation of rendering background sound by a single HOA sound source. A single HOA stage 727 may be an operation of converting a signal in an equivalent spatial domain (ESD) format input by the bitstream 605 into HOA and converting the converted HOA signal into a binaural signal through a magnitude least squares MagLS decoder. That is, the single HOA stage 727 may be an operation of converting input audio into HOA and spatially combining and converting a signal through HOA decoding.

A uniform volume sound source stage 729 may be an operation of rendering a sound source (e.g., a uniform volume sound source) having a single characteristic and a spatial size. The uniform volume sound source stage 729 may be an operation of mimicking effects of multiple sound sources in a volume sound source space through a decorrelated stereo sound source. The uniform volume sound source stage 729 may be an operation of generating an effect of a sound source blocked based on information of the obstacle stage 711, in the case of the effect of the sound source being partially blocked.

A panner stage 731 may be an operation of rendering multi-channel reverberation. The panner stage 731 may be an operation of rendering an audio signal of each channel to head tracking-based global coordinates based on vector base amplitude panning (VBAP).

A multi HOA stage 733 may be an operation of generating 6DoF sound of content simultaneously using two or more HOA sound sources. That is, the multi HOA stage 733 may be an operation of performing 6DoF rendering on HOA sound sources with respect to a position of a listener using information of a spatial metadata frame. An output of 6DoF rendering of HOA sound sources may be 6DoF sound. Similar to the single HOA stage 727, the multi HOA stage 733 may be an operation of converting a signal in the ESD format into HOA and processing the signal.

Hereinafter, referring to FIGS. 8 to 12, an object-based audio signal rendering method and an apparatus for performing the same are described. According to one embodiment, an apparatus (e.g., an apparatus 1200 of FIG. 12) may perform a rendering method of an object-based audio signal. An apparatus 1200 may include a modified MPEG-I immersive audio renderer (e.g., the renderer 600 of FIG. 6).

The apparatus 1200 may render an object audio signal (e.g., an audio signal of an audio object) by dividing the object audio signal into RIs. The RI may include direct sound, direct reflection, and diffraction. Because one direct sound, multiple direct reflections, and multiple diffractions may be generated for each audio channel or audio object, multiple RIs may be generated for one audio channel or one audio object. The rendering method of an object-based audio signal may include a method of allocating a limiter to each object (e.g., the rendering method 1 of FIG. 8) and a method of allocating a limiter to each RI (e.g., the rendering method 2 of FIG. 9).

Figure 8:
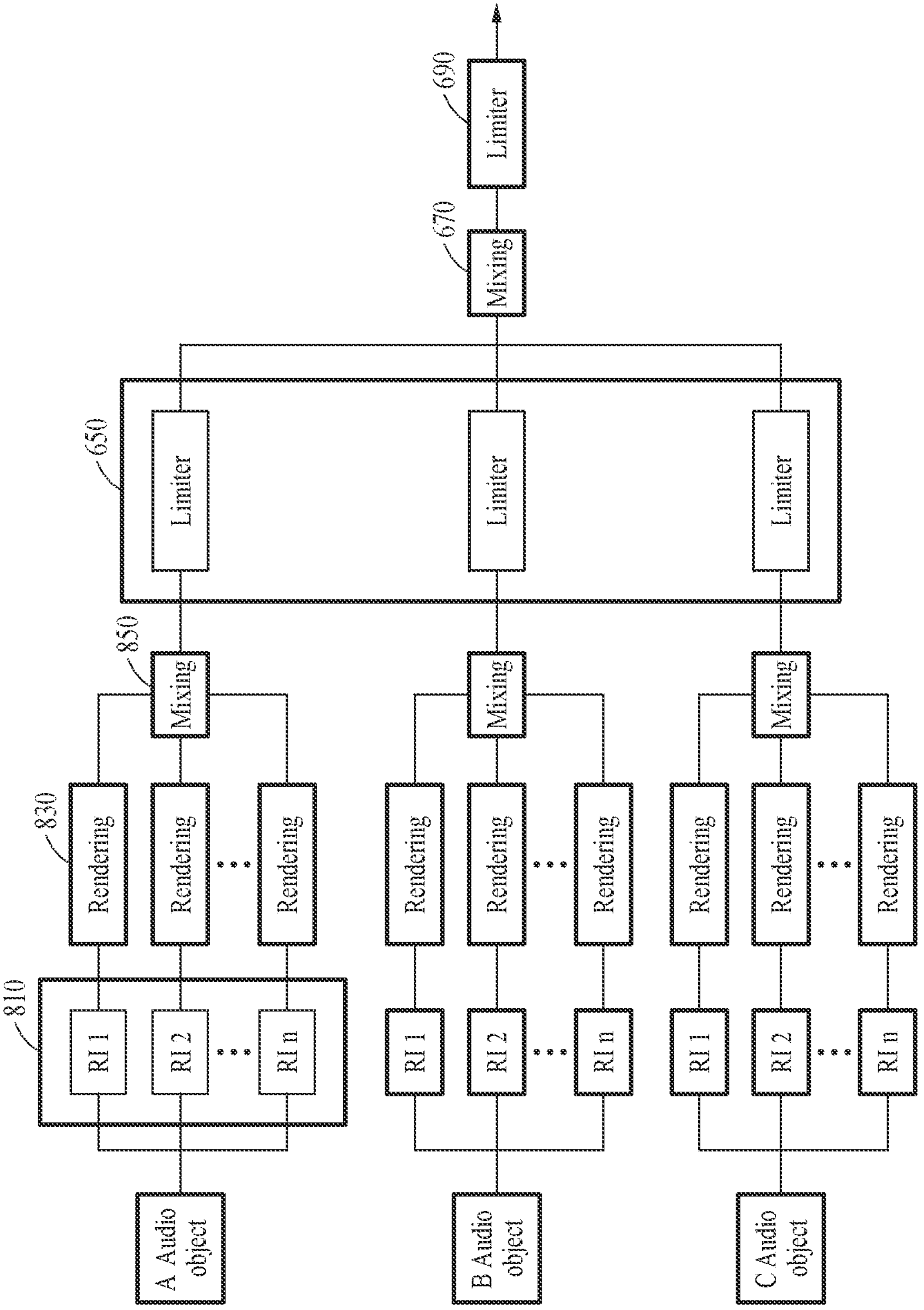
FIG. 8 is a diagram illustrating a rendering method 1 of an object-based audio signal, according to one embodiment.

FIG. 8 is a diagram illustrating a rendering method 1 of an object-based audio signal, according to one embodiment.

Referring to FIG. 8, according to one embodiment, N (e.g., N is a natural number greater than 1) RIs 810 may be generated by each audio object (e.g., an audio object A, an audio object B, and an audio object C). The apparatus 1200 may render 830 the RIs 810, respectively (e.g., RI 1 to RI n). The rendering 830 may be performed by a renderer module (e.g., the renderer module 610 of FIG. 6). The apparatus 1200 may mix 850 each of the rendered RIs by an audio object. The mixing 850 may be performed by a spatializer (e.g., the spatializer 630 of FIG. 6). The spatializer 630 may mix the RIs 810 by output channel. For example, the spatializer 630 may mix RIs of an object audio signal of a left (L) channel and may mix RIs of an object audio signal of a right (R) channel. The mixed 850 RIs may be output to the limiter 650 in the form of the object audio signal. The limiter 650 (e.g., a first limiter) may prevent clipping of the object audio signal. The limiter 650 (e.g., the first limiter) may include N (e.g., N is a natural number greater than 1) limiters. The N limiters may perform clipping prevention for an object audio signal by being respectively allocated to audio objects (e.g., the audio object A, the audio object B, and the audio object C). The limiter 650 may output the object audio signal to the mixer 670. The mixer 670 may mix the object audio signal again. The mixer 670 may output the object audio signal to the limiter 690. The limiter 690 (e.g., a second limiter) may prevent clipping of the object audio signal. That is, the rendering method 1 described with reference to FIG. 8 may be a method of preventing clipping of an object audio signal, which is an output obtained by mixing rendered RIs for each audio object, mixing the object audio signal again, and then performing clipping prevention again.

Figure 9:
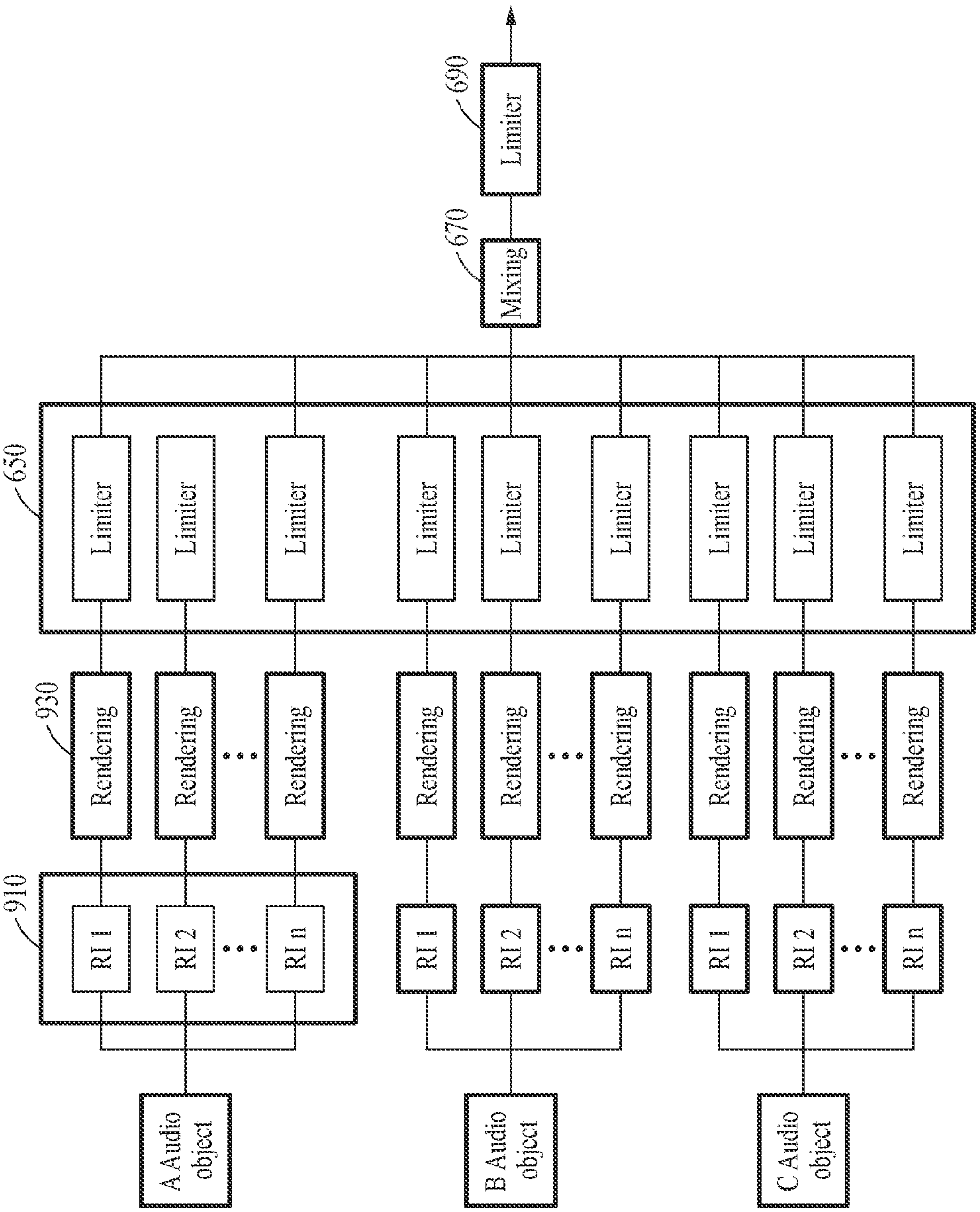
FIG. 9 is a diagram illustrating a rendering method of an object-based audio signal according to one embodiment.

FIG. 9 is a diagram illustrating a rendering method of an object-based audio signal according to one embodiment.

Referring to FIG. 9, according to one embodiment, N (e.g., N is a natural number greater than 1) RIs 910 may be generated by each audio object (e.g., an audio object A, an audio object B, and an audio object C). The apparatus 1200 may render 930 the RIs 910, respectively (e.g., RI 1 to RI n). The rendering 930 may be performed by a renderer module (e.g., the renderer module 610 of FIG. 6). The rendered 930 RIs may be output to the limiter 650. The limiter 650 (e.g., the first limiter) may include N (e.g., N is a natural number greater than 1) limiters. The N limiters may be allocated to RIs (e.g., RI 1 to RI n), respectively. The limiter 650 may prevent clipping of an RI and may output the RI to the mixer 670. The mixer 670 may mix RIs. The mixed Ms may be output to the limiter 690 in the form of a single audio signal (e.g., an audio signal including a plurality of object audio signals). The limiter 690 (e.g., a second limiter) may prevent clipping of the object audio signal. That is, the rendering method 2 described with reference to FIG. 9 may be a method of performing clipping prevention on each rendered RI, mixing the Ms into one audio signal, and then performing clipping prevention again.

Figure 10:
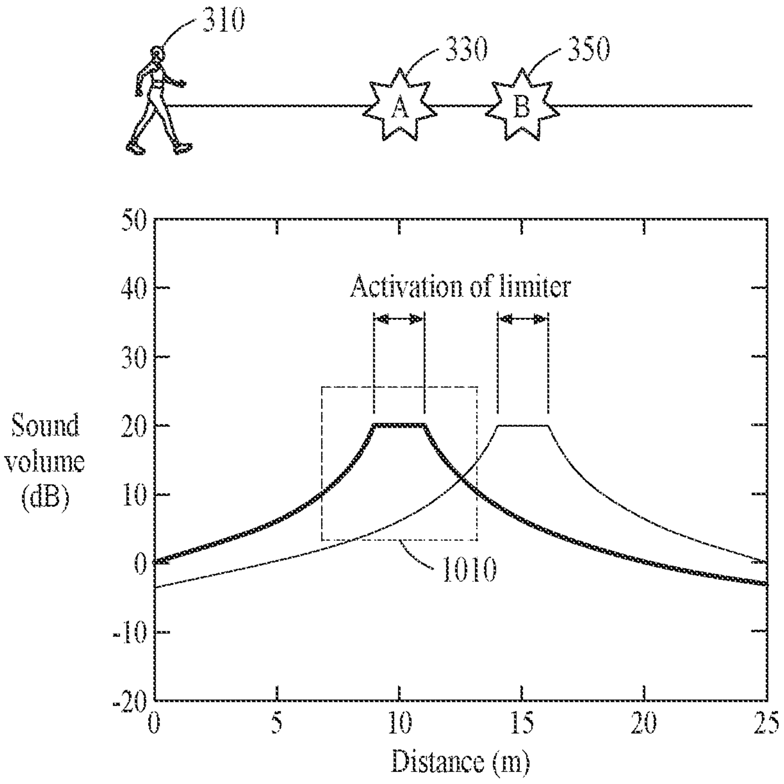
FIG. 10 illustrates a result of using a rendering method of an object-based audio signal according to one embodiment.

FIG. 10 illustrates a result of using a rendering method of an object-based audio signal according to one embodiment.

That is, FIG. 10 may be a diagram illustrating a rendering result of an object audio signal using the rendering methods described with reference to FIGS. 8 and 9.

Referring to FIG. 10, according to one embodiment, when performing rendering of an object-based audio signal using a modified MPEG-I immersive audio renderer (e.g., the renderer 600 of FIG. 6), a result may be different from a rendering result (e.g., the rendering result of FIG. 5) using an MPEG-I immersive audio standard renderer.

An assumption of placement of the listener 310, the audio object A 330, and the audio object B 350 of FIG. 10 may be the same as the conditions of FIGS. 3 to 5. At around the 10-meter point, as the listener 310 approaches the audio object A 330, a limiter (e.g., the limiter 650 and the limiter 690 of FIG. 6) may be activated. The limiter 650 and the limiter 690 may prevent 1010 clipping of an audio signal of the audio object A 330. A sound volume of the audio object B 350 may be affected by only a distance from the listener 310, and the event 510 of FIG. 5 may not occur. That is, clipping may be prevented and rendering may be performed without being affected by the sound volume of another audio object.

Figure 11:
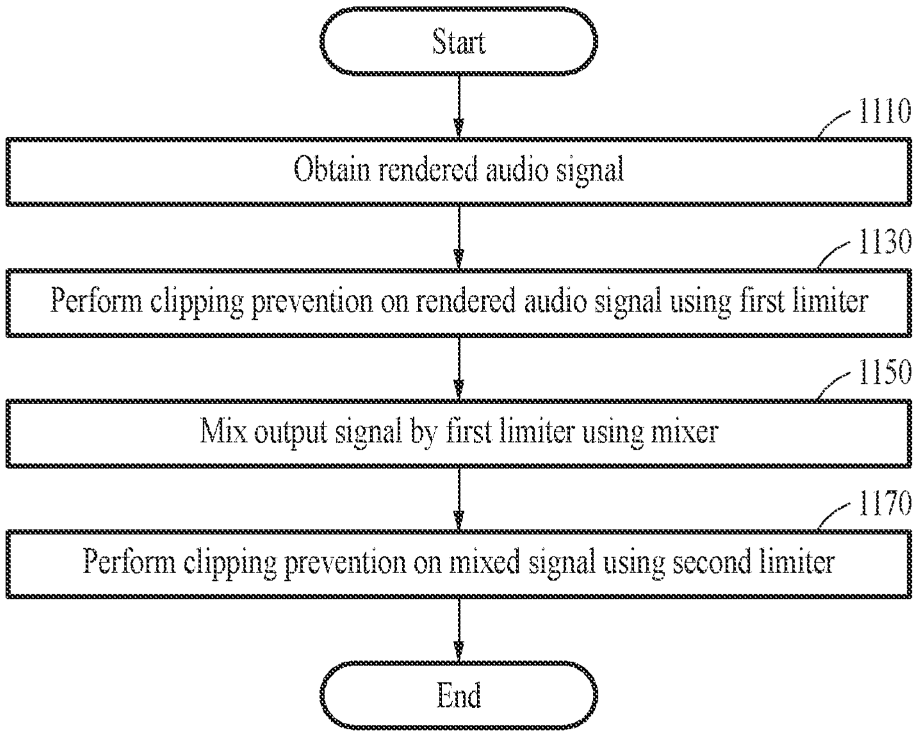
FIG. 11 is a flowchart illustrating a rendering method of an object-based audio signal according to one embodiment.

FIG. 11 is a flowchart illustrating a rendering method of an object-based audio signal according to one embodiment.

Operations 1110 to 1170 may be substantially the same as the rendering method used by the apparatus (e.g., the apparatus 1200 of FIG. 12) described with reference to FIGS. 8 to 12.

In operation 1110, the apparatus 1200 may obtain a rendered audio signal. The rendered audio signal may include an audio signal, which is an output obtained by rendering 830 RIs 810 and mixing 850 the RIs 810 by object as shown in FIG. 8 or an output obtained by rendering 930 RIs 910 as shown in FIG. 9.

In operation 1130, the apparatus 1200 may perform clipping prevention on the rendered audio signal obtained in operation 1110 by using a first limiter (e.g., the limiter 650 of FIG. 6).

In operation 1150, the apparatus 1200 may mix a signal output by the first limiter by using a mixer (e.g., the mixer 670 of FIG. 6).

In operation 1170, the apparatus 1200 may perform clipping prevention on the mixed signal by using a second limiter (e.g., the limiter 690 of FIG. 6).

Operations 1110 to 1170 may be performed sequentially, but examples are not limited thereto. For example, two or more operations may be performed in parallel.

Figure 12:
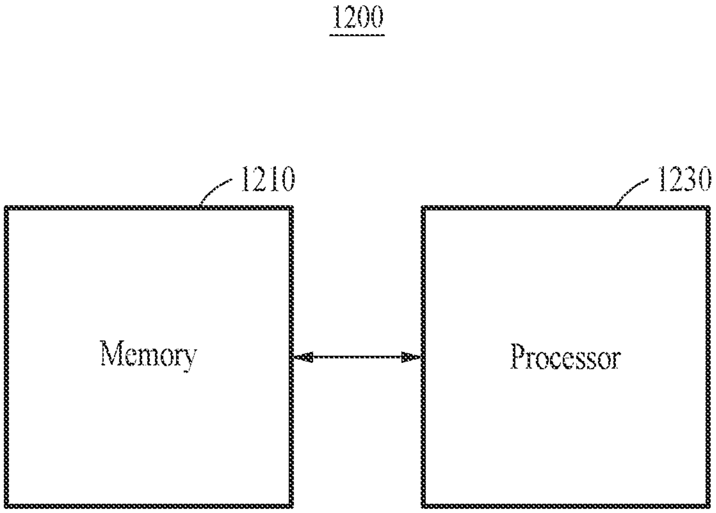
FIG. 12 is a schematic block diagram illustrating an apparatus according to one embodiment.

FIG. 12 is a schematic block diagram illustrating an apparatus according to one embodiment.

Referring to FIG. 12, according to one embodiment, the apparatus 1200 may be a rendering apparatus for an object-based audio signal. The apparatus 1200 may perform the rendering method of an object-based audio signal described with reference to FIGS. 6 to 11. The apparatus 1200 may include a memory 1210 and a processor 1230.

The memory 1210 may store instructions (or programs) executable by the processor 1230. For example, the instructions include instructions for performing an operation of the processor 1230 and/or an operation of each component of the processor 1230.

The memory 1210 may include one or more of computer-readable storage media. The memory 1210 may include non-volatile storage elements (e.g., a magnetic hard disk, an optical disc, a floppy disc, a flash memory, electrically programmable memory (EPROM), and electrically erasable and programmable memory (EEPROM).

The memory 1210 may be a non-transitory medium. The term “non-transitory” may indicate that the storage medium is not embodied in a carrier wave or a propagated signal. However, the term “non-transitory” should not be interpreted to mean that the memory 1210 is non-movable.

The processor 1230 may process data stored in the memory 1210. The processor 1230 may execute computer-readable code (e.g., software) stored in the memory 1210 and instructions triggered by the processor 1230.

The processor 1230 may be a hardware-implemented data processing device having a circuit that is physically structured to execute desired operations. For example, the desired operations may include code or instructions included in a program.

The hardware-implemented data processing device may include, for example, a microprocessor, a central processing unit (CPU), a processor core, a multi-core processor, a multiprocessor, an application-specific integrated circuit (ASIC), and a field-programmable gate array (FPGA).

The operations performed by the processor 1230 may be substantially the same as the rendering method of an object-based audio signal in one embodiment described with reference to FIGS. 6 to 11. Accordingly, a detailed description thereof is omitted.

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The units described herein may be implemented using a hardware component, a software component and/or a combination thereof. A processing device may be implemented using one or more general-purpose or special-purpose computers, such as, for example, a processor, a controller and an arithmetic logic unit (ALU), a DSP, a microcomputer, an FPGA, a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, the processing device may include a plurality of processors, or a single processor and a single controller. In addition, different processing configurations are possible, such as parallel processors.

The software may include a computer program, a piece of code, an instruction, or some combination thereof, to independently or collectively instruct or configure the processing device to operate as desired. Software and data may be stored in any type of machine, component, physical or virtual equipment, or computer storage medium or device capable of providing instructions or data to or being interpreted by the processing device. The software also may be distributed over network-coupled computer systems so that the software is stored and executed in a distributed fashion. The software and data may be stored by one or more non-transitory computer-readable recording mediums.

The methods according to the above-described examples may be recorded in non-transitory computer-readable media including program instructions to implement various operations of the above-described examples. The media may also include, alone or in combination with the program instructions, data files, data structures, and the like. The program instructions recorded on the media may be those specially designed and constructed for the purposes of examples, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher-level code that may be executed by the computer using an interpreter.

The above-described devices may be configured to act as one or more software modules in order to perform the operations of the above-described examples, or vice versa.

As described above, although the examples have been described with reference to the limited drawings, a person skilled in the art may apply various technical modifications and variations based thereon. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A rendering method of an object-based audio signal, the rendering method comprising:
- obtaining a rendered audio signal;
- performing clipping prevention on the rendered audio signal using a first limiter;
- mixing a signal output by the first limiter using a mixer; and
- performing clipping prevention on the mixed signal using a second limiter,
- wherein the first limiter comprises a plurality of limiters, and
- wherein each of the plurality of limiters is allocated to each audio object.

2. The rendering method of claim 1, wherein the rendered audio signal is obtained by rendering a plurality of render items generated by an audio object and mixing the render items for each object.

3. The rendering method of claim 1, wherein the rendered audio signal is obtained by rendering a single render item generated by an audio object.

4. The rendering method of claim 1, wherein each of the plurality of limiters is allocated to each render item generated by an audio object.

5. A non-transitory computer-readable storage medium storing instructions that, when executed by a processor, cause the processor to perform the rendering method of claim 1.

6. An apparatus for rendering an object-based audio signal, the apparatus comprising:
- a memory comprising instructions; and
- a processor electrically connected to the memory and configured to execute the instructions,
- wherein the processor performs a plurality of operations when the instructions are executed by the processor, and
- wherein the plurality of operations further comprises:
  - obtaining a rendered audio signal;
  - performing clipping prevention on the rendered audio signal using a first limiter;
  - mixing a signal output by the first limiter using a mixer; and
  - performing clipping prevention on the mixed signal using a second limiter,
- wherein the first limiter comprises a plurality of limiters, and
- wherein each of the plurality of limiters is allocated to each audio object.

7. The apparatus of claim 6, wherein the rendered audio signal is obtained by rendering a plurality of render items generated by an audio object and mixing the render items for each object.

8. The apparatus of claim 6, wherein the rendered audio signal is obtained by rendering a single render item generated by an audio object.

9. The apparatus of claim 6, wherein each of the plurality of limiters is allocated to each render item generated by an audio object.

* * * * *